(12) United States Patent
Lee et al.

(10) Patent No.: US 9,537,113 B2
(45) Date of Patent: Jan. 3, 2017

(54) ORGANIC LIGHT EMITTING DISPLAY DEVICE

(71) Applicant: LG Display Co., Ltd., Seoul (KR)

(72) Inventors: Se-Hee Lee, Gyeonggi-do (KR); Eun-Jung Park, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/724,131

(22) Filed: Dec. 21, 2012

(65) Prior Publication Data

US 2014/0061599 A1 Mar. 6, 2014

(30) Foreign Application Priority Data

Sep. 4, 2012 (KR) .................. 10-2012-0097905

(51) Int. Cl.
*H01L 51/52* (2006.01)
*H01L 51/50* (2006.01)
*H01L 51/00* (2006.01)
*H01L 27/32* (2006.01)

(52) U.S. Cl.
CPC ....... *H01L 51/5203* (2013.01); *H01L 51/5024* (2013.01); *H01L 27/3244* (2013.01); *H01L 51/006* (2013.01); *H01L 51/0052* (2013.01); *H01L 51/0059* (2013.01); *H01L 51/0072* (2013.01); *H01L 51/0085* (2013.01); *H01L 51/0087* (2013.01); *H01L 51/0094* (2013.01); *H01L 2251/5384* (2013.01)

(58) Field of Classification Search
CPC .. H01L 51/5203; H01L 51/52; H01L 51/5024; H01L 51/0052; H01L 51/0059; H01L 51/006; H01L 51/0072; H01L 51/0085; H01L 51/0087; H01L 51/0094; H01L 27/3244; H01L 2251/5384

USPC ........ 257/79–103, 57, 59, 66, 72, 359, 390, 257/443, E21.411, E21.412, E51.005, 257/E29.151, E27.1, E29.117; 438/30, 438/149, 158–159

See application file for complete search history.

(56) References Cited

U.S. PATENT DOCUMENTS

2005/0280355 A1 12/2005 Lee et al.
2006/0017377 A1 1/2006 Ryu
2009/0231243 A1 9/2009 Song
(Continued)

FOREIGN PATENT DOCUMENTS

CN 1711001 A 12/2005
CN 1725921 A 1/2006
(Continued)

OTHER PUBLICATIONS

Office Action dated Apr. 30, 2014 from the Korean Patent Office in counterpart Korean application No. 10-2012-0097905.
(Continued)

*Primary Examiner* — Fernando L Toledo
*Assistant Examiner* — Lawrence-Linh T Nguyen
(74) *Attorney, Agent, or Firm* — Morgan, Lewis & Bockius LLP (57) ABSTRACT

An organic light emitting display device with improved thermal reliability is disclosed. The organic light emitting display device includes a substrate, and an organic light emitting device that includes a first electrode, an organic light emitting layer including a first host, a second host, and a dopant, and a second electrode sequentially stacked on the substrate. The first host and the second host have different glass transition temperatures.

8 Claims, 3 Drawing Sheets

(56) References Cited

U.S. PATENT DOCUMENTS

| | | | |
|---|---|---|---|
| 2009/0309093 A1* | 12/2009 | Iwaki | C09K 11/06 257/40 |
| 2011/0037056 A1* | 2/2011 | Dubois et al. | 257/40 |
| 2012/0164772 A1 | 6/2012 | Lee | |

FOREIGN PATENT DOCUMENTS

| | | |
|---|---|---|
| CN | 101533852 A | 9/2009 |
| CN | 102239230 A | 11/2011 |
| CN | 102244205 A | 11/2011 |
| CN | 102569660 A | 7/2012 |
| CN | 102569676 A | 7/2012 |
| JP | 2011-210873 A | 10/2011 |

OTHER PUBLICATIONS

Office Action dated Sep. 18, 2016, from the State Intellectual Property Office of the People's Republic of China in counterpart Chinese application No. 201210567626.1.

* cited by examiner

ORGANIC LIGHT EMITTING DISPLAY DEVICE

This application claims the benefit of Korean Patent Application No. 10-2012-0097905, filed on Sep. 4, 2012 which is hereby incorporated by reference as if fully set forth herein.

BACKGROUND OF THE INVENTION

Field of the Invention

The present invention relates to an organic light emitting display (OLED) device, and more particularly, to an OLED device with improved thermal reliability.

Discussion of the Related Art

For an image display device which displays a variety of information on a screen as a core technology in advanced information and communication, there is continuous progress in development of slim, light-weight, and portable devices with improved performance. Hereupon, an organic light emitting display (OLED) device for controlling light intensity of an organic light emitting layer is recently receiving attention as a flat panel display device, along with demand for a flexible display capable of being bent pursuant to convenience and space utilization.

The OLED device can have a slim structure, include devices formed on a flexible substrate such as a plastic substrate, and be driven at a lower voltage, for example, at 10 V or less, than voltages required for a plasma display panel or an inorganic electroluminescent display, thereby reducing power consumption. In addition, much attention has been paid to OLED devices, since they are light-weight and realize high color quality.

Particularly, OLED devices are classified into active matrix organic light emitting display (AMOLED) devices and passive matrix organic light emitting display (PMOLED) devices. An AMOLED device displays an image using pixels including red, green, and blue sub-pixels arranged in a matrix form. Each sub-pixel includes an organic light emitting device and a cell driving unit that drives the organic light emitting device.

The cell driving unit includes at least two thin film transistors (TFTs) and a storage capacitor which are connected among a gate line supplying a scan signal, a data line supplying a video data signal, and a common power line supplying a common power signal to drive a first electrode of the organic light emitting device.

The organic light emitting device includes a first electrode, an organic light emitting layer, and a second electrode sequentially stacked and emits light using binding energy generated via combination of electrons and holes introduced into the organic light emitting layer by applying an electric filed to the first and second electrodes. The organic light emitting layer includes a host and a dopant and emits red, green, and blue light according to the types of the dopant and the host. The OLED device embodies full color emission by red, green, and blue sub-pixels respectively emitting red, green, and blue light.

However, if a host of the organic light emitting layer has a low glass transition temperature (Tg), quality of colors realized by the sub-pixels may be deteriorated by heat generated during emission of the organic light emitting device and operation of the TFT.

If a host has a low glass transition temperature, properties of the host change by heat to deteriorate quality of colors. Accordingly, color coordinates are partially changed to reduce a color reproduction rate. Particularly, when a host of a red organic light emitting layer has a lower glass transition temperature than those of green and blue organic light emitting layers so as to be vulnerable to heat, color purity and emission intensity of a red sub-pixel are relatively reduced. Thus, an OLED panel that realizes white light by mixing light emitted by red, green, and blue sub-pixels emits bluish green light instead of white light. As a result, reliability of the OLED device is reduced.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device capable of improving thermal reliability of an organic light emitting device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes a substrate, and an organic light emitting device that includes a first electrode, an organic light emitting layer including a first host, a second host, and a dopant, and a second electrode sequentially stacked on the substrate. The first host and the second host have different glass transition temperatures.

The glass transition temperature of the second host may be higher than the glass transition temperature of the first host by 10° C. or more.

The glass transition temperature of the first host may be 120° C. or less.

The glass transition temperature of the second host may be 130° C. or greater.

A mass ratio of the first host to the second host may be 3:1~1:3.

The dopant may be a phosphorescent or fluorescent dopant.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting display (OLED) device according to the present invention will be described.

Figure 1:
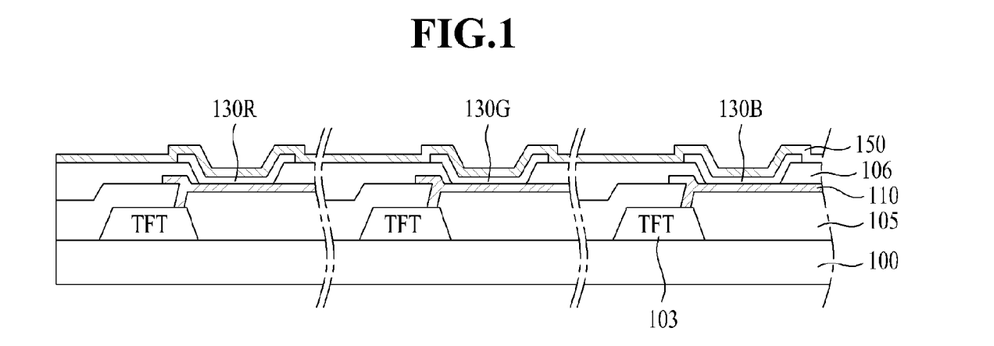
FIG. 1 is a cross-sectional view illustrating an OLED device according to an embodiment of the present invention.
Figure 2:
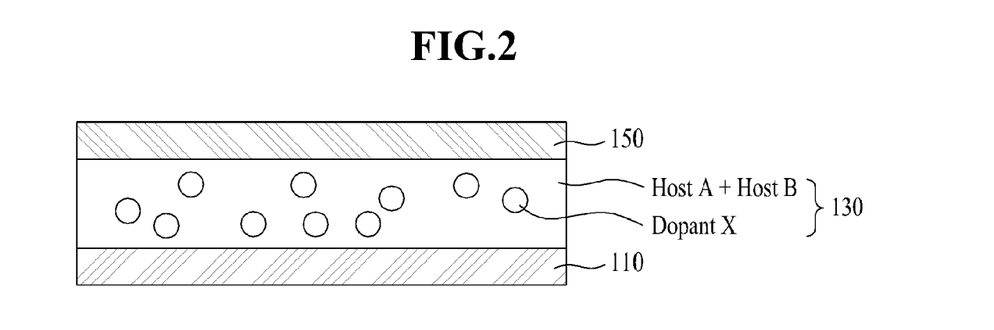
FIG. 2 is a cross-sectional view of an organic light emitting device of FIG. 1.

FIG. 1 is a cross-sectional view illustrating an OLED device according to an embodiment of the present invention. FIG. 2 is a cross-sectional view of an organic light emitting device of FIG. 1.

Referring to FIG. 1, the OLED device according to the present invention includes a substrate 100 and an organic light emitting device including a first electrode 110, organic light emitting layers 130R, 130G, and 130B (130) including hosts and dopants, and a second electrode 150 sequentially stacked on the substrate 100. An encapsulation layer (not shown) may further be formed on the organic light emitting device in order to prevent external moisture or oxygen from penetrating into the organic light emitting device.

Particularly, thin film transistors (TFTs) 103 are formed on the substrate 100 to respectively correspond to sub-pixels. The TFT 103 may be selected from the group consisting of an oxide TFT using an oxide such as indium gallium zinc oxide (IGZO), zinc oxide (ZnO), and titanium oxide (TiO) as a semiconductor layer, an organic TFT using an organic material as a semiconductor layer, an amorphous silicon TFT using amorphous silicon as a semiconductor layer, and a poly silicon TFT using poly silicon as a semiconductor layer.

Then, the first electrode 110 of the organic light emitting device is connected to the TFT 103 via a contact hole formed by selectively removing a protective layer 105 formed over the entire surface of the substrate 100 to cover the TFT 103. The first electrode 110 is an anode supplying holes into the organic light emitting layer 130. If the OLED device according to the current embodiment is a top emission type OLED device that emits light generated in the organic light emitting layer 130 out of the top surface of the device, the first electrode 110 is formed of a transparent conductive material such as tin oxide (TO), indium tin oxide (ITO), indium zinc oxide (IZO), and indium tin zinc oxide (ITZO).

The OLED device may further include a reflective layer (not shown) disposed under the first electrode 110 such that light emitted from the organic light emitting layer 130 is reflected thereby and progresses toward the top surface, and the reflective layer (not shown) may be formed of a material with excellent reflectivity such as aluminum (Al), an Al alloy, chromium (Cr), silver (Ag), molybdenum (Mo), molybdenum tungsten (MoW), titanium (Ti), nickel (Ni), and any alloy thereof, preferably, aluminum neodymium (Al—Nd) with excellent reflection efficiency.

A bank insulating layer 106 having bank holes exposing portions of the first electrode 110 is formed on the protective layer 105 to partition the sub-pixels. The red, green, blue organic light emitting layers 130R, 130G, and 130B (130) are formed on the first electrode 110 exposed by the bank holes.

Although not shown herein, a hole injection layer (HIL, not shown) and a hole transport layer (HTL, not shown) are further disposed between the first electrode 110 and the organic light emitting layer 130 for transporting holes injected from the first electrode 110 to the organic light emitting layer 130. In this regard, the HIL (not shown) and the HTL (not shown) may be formed as a single layer, thereby reducing manufacturing costs and improving productivity and yield. In addition, by forming the HIL (not shown) and the HTL (not shown) as a single layer, the interface through which charges are moving is reduced to lower driving voltage, thereby reducing power consumption of the OLED device.

In particular, if light from the organic light emitting layer 130 progresses toward the top surface of the OLED device and is emitted to the outside thereof, or if primary light progressing to the reflection layer (not shown) disposed under the organic light emitting layer 130 interferes with secondary light reflected by the reflective layer (not shown) and progresses to the top surface of the OLED device, causing destructive interference, emission efficiency is reduced. In order to prevent reduction of emission efficiency, thickness of an HTL (not shown) of each of the sub-pixels may vary, thereby improving emission efficiency.

The second electrode 150 is formed on the organic light emitting layer 130. The second electrode 150 is a cathode formed of a material selected from the group consisting of Al, Ag, Mg, and Mg:Ag. Particularly, if the OLED device according to the present invention is a top emission type OLED device, the second electrode 150 may have a low thickness to allow light to pass therethrough.

Although not shown herein, an electron transport layer (ETL, not shown) and an electron injection layer (EIL, not shown) may further be disposed between the organic light emitting layer 130 and the second electrode 150. The ETL (not shown) may be formed of a material with excellent electron transport capability such as tris(8-hydroxyquinolino)aluminum (Alq3), and the EIL (not shown) may be formed of a metallic compound such as lithium fluoride (LiF). In addition, the ETL (not shown) and the EIL (not shown) may also be formed as a single layer as the HIL (not shown) and the HTL (not shown).

In such OLED devices, holes injected from the first electrode 110 and electrons injected from the second electrode 150 are combined in the organic light emitting layer 130 to generate excitons, and light is emitted by energy generated while the excitons transition from an excited state to a ground state. Particularly, the organic light emitting layer 130 emits red R, green G, and blue B light according to the types of the dopants and realizes full color emission by the R, G, and B sub-pixels respectively emitting red, green, and blue light.

However, as described above, if the host of the organic light emitting layer 130 has a low glass transition temperature (Tg), the host is crystallized by heat. Thus, quality of colors emitted from the sub-pixels may be deteriorated by heat generated during emission of the organic light emitting device and operation of the TFT 103.

Accordingly, as shown in FIG. 2, the organic light emitting layer 130 of the OLED device according to the present invention includes first and second hosts Host A and Host B and a dopant Dopant X. The glass transition temperatures of the first and second hosts Host A and Host B are different from each other.

In general, if two low molecular weight materials are mixed, the natures of the low molecular weight materials are not changed since the low molecular weight materials do not have chain structures. However, if two polymer materials, each having a chain structure, are mixed, the natures of the polymer materials are changed since chain structures of the polymer materials are entangled with each other. That is, if the organic light emitting layer 130 is formed by mixing the first and second hosts Host A and Host B having different glass transition temperatures with the dopant Dopant X, density of the organic light emitting layer 130 considerably increases, leading to an increase in interference between molecules thereof. Thus, similarly to the changes of the physical properties of the polymer materials, the first and second hosts Host A and Host B having different glass transition temperatures are entangled with each other, increasing the glass transition temperature.

Figure 3A:
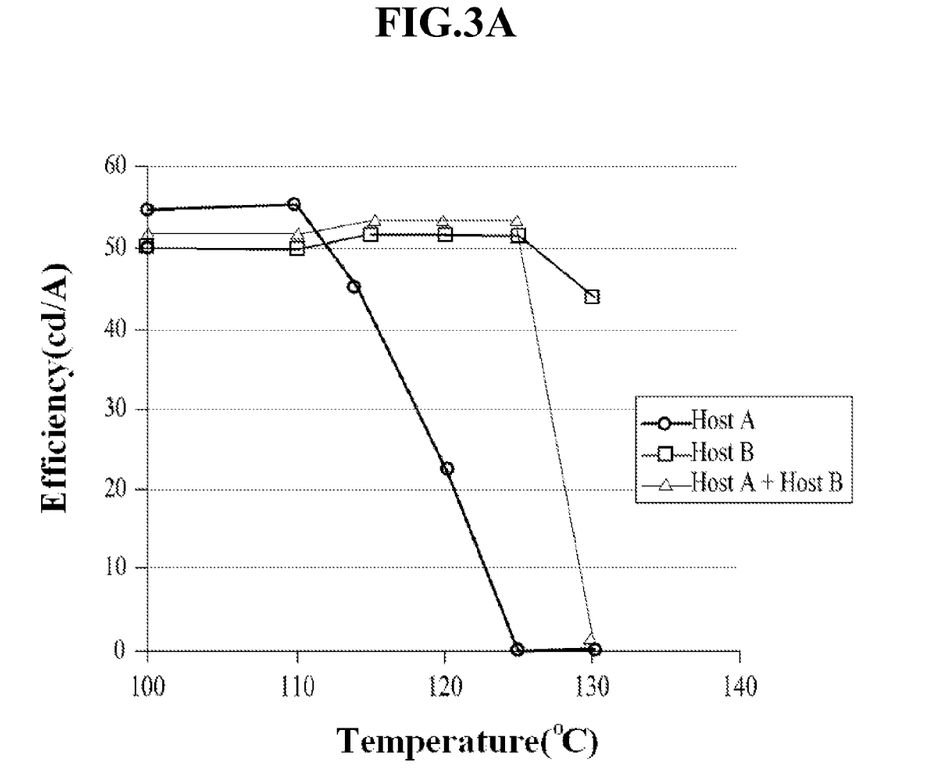
FIGS. 3A and 3B are graphs illustrating emission efficiencies of red sub-pixels with respect to temperature.
Figure 3B:
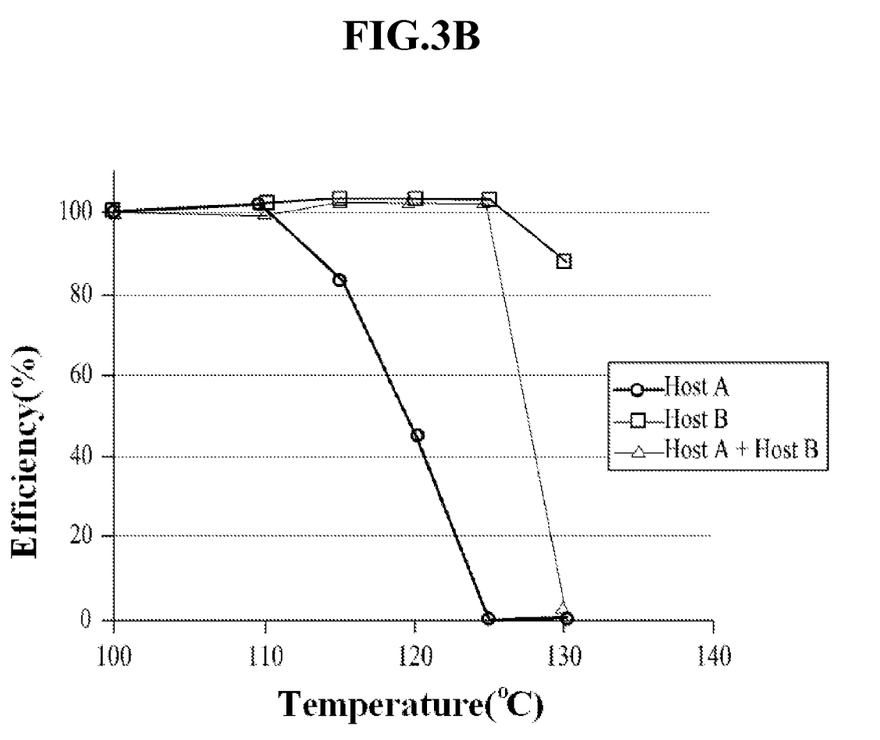

FIGS. 3A and 3B are graphs illustrating emission efficiencies of red sub-pixels with respect to temperature.

In detail, FIGS. 3A and 3B show efficiencies of a first red sub-pixel including the first host Host A having a glass transition temperature (Tg) of 111° C. alone, a second red sub-pixel including a second host Host B having a glass transition temperature of 170° C. alone, and a third red sub-pixel including the first and second hosts Host A and Host B at 1:1 on the basis of mass ratio. The other elements of the first, second, and third red sub-pixels are the same, except for the hosts. In this regard, FIG. 3A shows measured efficiencies, and FIG. 3B shows percentages of the efficiencies.

As shown in FIG. 3A, among initial emission efficiencies of the first, second, and third red sub-pixels measured at 100° C., the initial emission efficiency of the first red sub-pixel is the highest. However, the emission efficiency of the first red sub-pixel starts decreasing at 111° C., the glass transition temperature of the first host Host A, and the emission efficiency of the second red sub-pixel starts decreasing at about 130° C.

Emission efficiency of the third red sub-pixel starts decreasing at 130° C., which is about 20° C. is higher than that of the first host Host A, due to the second host Host B having a glass transition temperature of 170° C. although the third red sub-pixel includes the first host Host A having a glass transition temperature of 111° C. This is because, the first host Host A and the second host Host B physically interfere with each other in the organic light emitting layer having a high density.

As shown in FIG. 3B, the third red sub-pixel including both the first and second hosts Host A and Host B has a higher temperature, at which the initial emission efficiency is reduced by more than 10%, than the first red sub-pixel including the first host Host A alone. Thus, an OLED device including both of the first and second hosts Host A and Host B has better thermal reliability and higher emission efficiency than an OLED device including the first host Host A or the second host Host B alone, resulting in reducing panel defects.

In general, if initial emission efficiency is reduced by more than 10%, it is determined that reliability of the OLED panel is not satisfactory. At a temperature at which the initial emission efficiency is reduced by more than 10%, the organic light emitting layer may partially have dark spots by crystallization of the host or may be burnt by heat.

That is, an organic light emitting layer including a host with a low glass transition temperature affecting thermal reliability, even when having high efficiency, has low thermal reliability. Thus, color purity and emission intensity of the OLED device are reduced. Thus, thermal reliability of the OLED device may be improved by mixing a host having high efficiency and a low glass transition temperature with a host having a high glass transition temperature.

For example, the first and second hosts Host A and Host B may be an organic material or a metal complex selected from the group consisting of Formulae 1 to 20 below.

Formula 1

TNFL, Tg = 169° C., IP = 5.24 eV

Formula 2

TFLFL, Tg = 186° C., IP = 5.23 eV

Formula 3

HFM 1, Tg = 110° C., IP = 5.1 eV

-continued

Formula 4

Tris(8-hydroxyquinolinate)aluminum
(AlQ3)

Formula 5

4,4′,4″tri(N carbazolyl)triphenylamine
(TCTA), Tg = 151° C., IP = 5.7 eV Formula 6

(Tg = 178° C., IP = 5.6 eV)

Formula 7

(m-TPEE, Tg = 98° C., IP = 5.4 eV)

-continued

Formula 8

N, N′-bis(3-methylphenyl)-N,N′-diphenyl-[1,1′-biphenyl]-4,4′-(diamine) (TPD), IP = 5.4 eV Formula 9

N, N′-bis(1-naphthyl)-N,N′-diphenyl-[1,1′-biphenyl]-4,4′-(diamine) (TPB), IP = 5.4 eV Formula 10

(FTPD)
Tg = 80-110° C., IP = 5.4 eV

Formula 11

(NDA)PP, Tg = 194° C., IP = 5.5 eV

Formula 12

(Tg, 140° C., Spiro-NPD)

Formula 13

(OPT 1, Tg = 147° C.)

Formula 14 spiro-FPA

Formula 15

BTP

Formula 16

Formula 17

Formula 18

DDP

Formula 19

Formula 20

In this regard, a mass ratio of the first host Host A to the second host Host B may be in the range of 10:0.1 to 0.1:10, preferably, 3:1~1:3. Particularly, when the glass transition temperature difference between the first host Host A and the second host Host B is above a certain level, increase in the glass transition temperature of the organic light emitting layer may be anticipated. Thus, the glass transition temperature difference may be 10° C. or greater, the glass transition temperature of the first host Host A may be 120° C. or less, and the glass transition temperature of the second host Host B may be 130° C. or greater. For example, if the glass transition temperature of the first host Host A is 111° C., the glass transition temperature of the second host Host B may be 141° C. or greater.

In addition, the dopant Dopant X of the organic light emitting layer 130 may be a fluorescent or phosphorescent dopant. Both of the first and second hosts Host A and Host B may be materials for improving electron or hole transport capabilities, or one of the first and second hosts Host A and Host B may be a material for improving electron transport capabilities, and the other may be a material for improving hole transport capabilities. In this regard, the organic light emitting layer 130 is formed by co-depositing the first and second hosts Host A and Host B and the dopant Dopant X.

In detail, the dopant of the red organic light emitting layer 130R may be a phosphorescent dopant such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (tOEP), or a fluorescent dopant such as PBD: Eu(DBM)$_3$(Phen) and perylene.

The dopant of the green organic light emitting layer 130G may be a phosphorescent dopant such as fac-tris(2-phenylpyridine)iridium (Ir(ppy)$_3$) or a fluorescent dopant such as tris(8-hydroxyquinolino)aluminum (Alq3). The dopant of the blue organic light emitting layer 130B may be a phosphorescent dopant such as (4,6-F2ppy)2Irpic or a fluorescent dopant such as spiro-DPVBi, spiro-6P, distyryl benzene (DSB), distyryl arylene (DSA), PFO-based polymers, and PPV-based polymers.

Table 1 below shows brightness changes of the OLED device with respect to temperature. The red (R) sub-pixel includes an organic light emitting layer including the first host Host A having a glass transition temperature of 111° C. and the second host Host B having a glass transition temperature of 170° C. The green (G) and blue (B) sub-pixels respectively include an organic light emitting layer including only one host. In addition, W indicates white light realized by mixing light emitted from the R, G, and B sub-pixels.

TABLE 1

| Sub-pixel | Temp. Ref | | | | 110 | | | | 120 | | | | 130 | | | |
| --- | --- | --- | --- | --- | --- | --- | --- | --- | --- | --- | --- | --- | --- | --- | --- | --- |
| | R | G | B | W | R | G | B | W | R | G | B | W | R | G | B | W |
| Brightness (cd/m$^2$) | 186 | 398 | 54 | 614 | 189 | 411 | 56 | 633 | 191 | 423 | 56 | 647 | 101 | 373 | 51 | 502 |
| Remark | — | — | — | — | — | — | — | — | — | — | — | — | 45%↓ | 7%↓ | — | 23%↓ |

As described above, the red sub-pixel includes the organic light emitting layer including the first host Host A having a glass transition temperature of 111° C. and the second host Host B having a glass transition temperature of 170° C. However, as shown in Table 1, brightness of the red sub-pixel is not reduced at 110° C. and at 120° C. that is higher than the glass transition temperature of the first host Host A. This is because molecules of the first host Host A and the second host Host B physically interfere with each other in the organic light emitting layer.

Accordingly, brightness of a display device realizing white light by mixing light emitted by the R, G, and B sub-pixels is not significantly different from that of a comparative example (Ref). In addition, brightness of the red sub-pixel starts decreasing at 130° C., higher than the glass transition temperature of the first host Host A by about 20° C. Brightness of white light also decreases.

That is, since the OLED device according to the present invention includes the organic light emitting layer including the first and second hosts having different glass transition temperatures, the OLED device has improved thermal reliability and high emission efficiency, resulting in reducing defects of the OLED panel. Particularly, the organic light emitting layer including the first and second hosts is not limited to the red organic light emitting layer, but is also applicable to the green and blue organic light emitting layers.

As is apparent form the above description, since the organic light emitting layer of the OLED device according to the present invention includes a first host having a low glass transition temperature and a second host having a high glass transition temperature, the glass transition temperature of the organic light emitting layer increases due to entanglement of the first and second hosts. Thus, thermal reliability of the organic light emitting layer is improved, and defects of the OLED panel are reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device, comprising:
a substrate;
a first electrode formed on the substrate;
a hole injection layer and a hole transport layer on the first electrode;
an organic light emitting layer formed on the hole injection layer and the hole transport layer, wherein the organic light emitting layer comprises a first host, a second host and a dopant, all three of which are mixed together in a single layer;
an electron transport layer and an electron injection layer on the organic light emitting layer; and
a second electrode formed on the electron transport layer and the electron injection layer,
wherein the first host and the second host have different glass transition temperatures, and
wherein the glass transition temperature of the second host is higher than the glass transition temperature of the first host by 10° C. or more.

2. The organic light emitting display device of claim 1, wherein the glass transition temperature of the first host is 120° C. or less.

3. The organic light emitting display device of claim 1, wherein the glass transition temperature of the second host is 130° C. or greater.

4. The organic light emitting display device of claim 1, wherein the dopant is a phosphorescent or fluorescent dopant.

5. The organic light emitting display device of claim 1, wherein the first host and the second host are each formed of respective polymers which are different from each other.

6. The organic light emitting display device of claim 1, wherein a mass ratio of the first host to the second host is 3:1~1:3.

7. An organic light emitting display device, comprising:
a substrate;
a first electrode formed on the substrate;
a hole injection layer and a hole transport layer on the first electrode;
an organic light emitting layer formed on the hole injection layer and the hole transport layer, wherein the organic light emitting layer comprises a first host, a second host and a dopant, all three of which are mixed together in a single layer;
an electron transport layer and an electron injection layer on the organic light emitting layer; and
a second electrode formed on the electron transport layer and the electron injection layer,
wherein the first host and the second host have different glass transition temperatures, and
wherein a mass ratio of the first host to the second host is 3:1~1:3.

8. The organic light emitting display device of claim 7, wherein the first host and the second host are each formed of respective polymers which are different from each other.

* * * * *